United States Patent [19]

Darnault

[11] Patent Number: 5,432,464
[45] Date of Patent: Jul. 11, 1995

[54] APPLICATION SPECIFIC INTEGRATED CIRCUIT INCLUDING A MICROPROCESSOR FOR CUSTOMIZED FUNCTIONS AS DEFINED BY THE USER

[75] Inventor: Patrick Darnault, Cergy-Pontoise, France

[73] Assignee: Societe d'Applications Generales d'Electricite et de Mecanique Sagem, France

[21] Appl. No.: 128,828

[22] Filed: Sep. 29, 1993

[51] Int. Cl.6 .................... H03K 19/173; H03K 19/00
[52] U.S. Cl. ......................................... 326/37; 326/16; 326/51; 364/716
[58] Field of Search ................ 307/465, 470, 471; 364/716; 326/37, 16, 51

[56] References Cited

U.S. PATENT DOCUMENTS 5,304,860  4/1994  Ashby et al. ................... 307/465
5,331,571  7/1994  Aronoff et al. ................. 307/465

FOREIGN PATENT DOCUMENTS

0457115A2  11/1991  European Pat. Off.
9000825.1  1/1990   Germany.
90/13043   11/1990  WIPO.

OTHER PUBLICATIONS

V. Immaneni et al., "Direct Access Test Scheme-Design of Block and Core Cells for Embedded Asics", IEEE, 1990, paper 23.3, pp. 488-492.

Primary Examiner—Edward P. Westin
Assistant Examiner—Richard Roseen
Attorney, Agent, or Firm—Albert C. Smith

[57] ABSTRACT

A type of electronic circuit, called an Application Specific Integrated Circuit (ASIC), is used to customize the functions in a semiconductor chip as defined by a user. ASIC includes a microprocessor, functional inputs and outputs, connection circuits, electronic gates, inhibition gates and links to perform "application specific" operations. The user chooses the functions and the arrangement of the various connection circuits from a menu of predetermined functions. Once the ASIC has been defined by the user, it is ready for manufacturing.

2 Claims, 1 Drawing Sheet

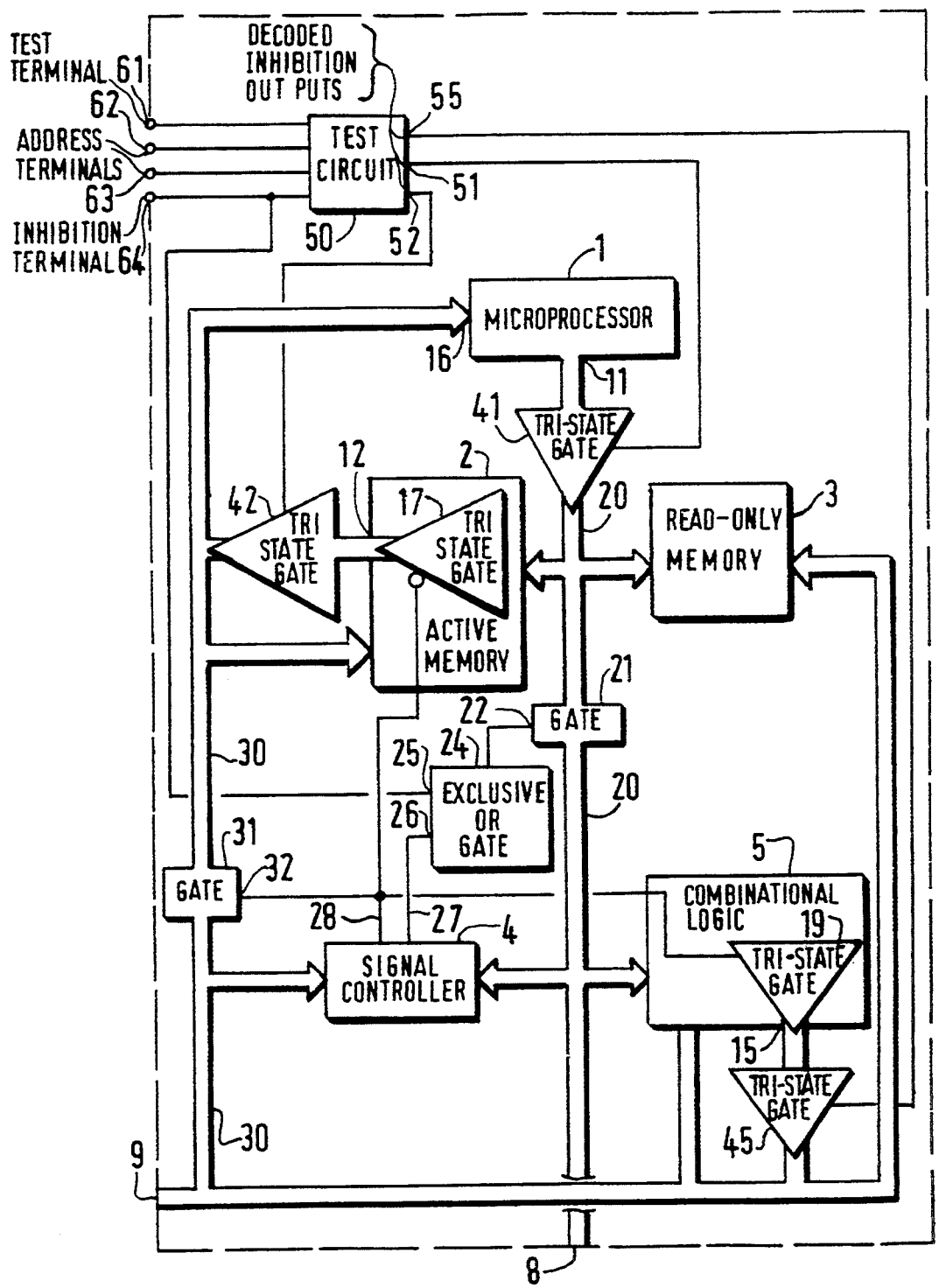

APPLICATION SPECIFIC INTEGRATED CIRCUIT INCLUDING A MICROPROCESSOR FOR CUSTOMIZED FUNCTIONS AS DEFINED BY THE USER

This invention pertains to an application specific integrated circuit, called ASIC (Application Specific Integrated Circuit), which contains a microprocessor which can be inhibited to test of several functions of the ASIC.

Application Specific Integrated Circuit is an electronic circuit which assembles, in the same substrate semi-conductor, the equivalent of many commercial integrated circuits of different proper functions, which can be specified by a user to program a new integrated circuit which responds precisely to the user's needs. Therefore, the substrate contains different zones with each zone insuring a predetermined function, such as a microprocessor function, a memory function, a logic function and a signal controller function.

The choice of functions and arrangement of the various connection circuits between the zones is performed by the user from a menu of predetermined functions which is given to the user by the future manufacturer or foundry of the ASIC. The functions are standardized and, in addition, the performances, such as the speed of function, of the ASIC are guaranteed. The latter being generally called "pre-characterized." Once the ASIC is so defined by the user, it may then be manufactured.

In the event that the user wishes to get immediately an ASIC which is immediately available, for example to quickly validate an electronic circuit, the manufacturer proposes a menu which has a list of standardized ASIC, commonly known as "pre-diffused" because they are already manufactured.

The user may then successively make two choices, one choice for the functions and the other for the links between these functions.

First, since each ASIC of this list contains a specific group of a certain number of predetermined functions, as the ones indicated above, the user therefore has a good chance of finding in this list an ASIC which, even if it is not of optimal composition with regards to such predetermined functions, can satisfy the immediate needs of the user.

Second, since the connection circuits between the inputs and the outputs of the functional circuits cannot be defined in advance and thus being proposed in the menu because it depends on the specific needs of the user, the proposed ASICs contain connection circuits linked to the several inputs and outputs of the functional circuits which are accessible from the linkup boundaries of the ASIC. Thus, once the user has the ASIC of his choice, he can make the second choice, for example, establish a linkage between certain connection circuits above mention. This allows linkage, each time, the transmission of a signal coming from an electronic circuit situated in a zone of the substrate of the ASIC, which performs a specific function, towards the input of another electronic circuit situated in another zone of the substrate, which performs another function. Thus the ASIC is personalized to perform an overall electronic function desired by the user, the ASIC being then an "application specific" circuit.

When the user want to validate an electronic circuit which contains a microprocessor and other integrated circuits commanded by such microprocessor, such as an ASIC without a microprocessor, a memory for software or data, logic circuits or a signal controller, a model is made on an electronic test card, without the microprocessor, which is replaced by a probe which diverts its connections towards an emulator.

An emulator is thus a device that allows the validation of an electronic circuit and which stimulates, by means of a memory chip which contains the software of the microprocessor, the functioning of such microprocessor, and to which it is a substitute. The emulator contains sophisticated means which permit the analysis and retention, in one of its memories, of the signals which it exchanges with the integrated circuits of the card, so that the user can find, localize and correct eventual failures of the software or of the connection circuits incorrectly placed between the integrated circuits of the card. Once validated, the software, which does not need any more modifications, may then be placed by the user in a fixed memory, called dead memory, situated on the card and connected to the microprocessor thereof, for future production.

The above process assumes that the microprocessor may easily be omitted from the card while leaving all the other circuits. This implies that the microprocessor function is not connected, within the same electronic circuit box, to other functions which are to remain on the card during the emulation.

This is no longer the case when the microprocessor is a microprocessor already integrated in a complex circuit, such as an ASIC, containing also in the same substrate semi-conductor, other functions.

An ASIC of this latter type is used, for example, in a facsimile machine to manage the exchanges of data with the connection line, as well as for the analysis and the local printing of such data.

In this case, the user has no other solution except to reproduce, on a test card, the multiple functions of the ASIC, through the use of commercial circuits with each circuit performing only one of the functions at a time.

This presents the inconvenience of producing the test card, which is costly and implies an additional delay for its production. In addition, since commercial integrated circuits are sold in separate and distinct boxes, they do not have the exactly similar analogical behavior than they would have if they were integrated in one electronic chip, and, as a consequence, even if the logical functions are tested, there could still remain analogical problems, nonrevealed by the test, which could hinder the correct logical functioning of the ASIC, once produced.

This invention aims to eliminate these inconveniences.

To that effect, the invention pertains to an application specific integrated circuit (ASIC), which contains a microprocessor, of which at least one functional output is connected through a link to the functional input of an electronic circuit, among a plurality of electronic circuit of the same ASIC, the ASIC containing means for establishing an external linkage between the link and an input/output of the ASIC, characterized by the fact that the ASIC also contains means to inhibit electronic circuits and the microprocessor arranged functionally disconnect the functional output of the microprocessor from the link and at least one electronic gate, which is serially connected within the external linkage insuring the propagation of signals in one direction between the link and the input/output and which is arranged such that its direction can be reverse under a control signal issued from the means of inhibition.

Thus, the chip of the produced ASIC can be used to perform the test of the chip itself, by inactivating the microprocessor, with regards to the other electronic circuits of the ASIC, through one input of the ASIC which commands the inhibition means. The microprocessor may then be substituted with an emulator taking control of the connection circuits which are no longer controlled by an output of the microprocessor and thus activating the other electronic circuits, which function in their real environment as regards to their shared connections. If the emulator is linked at a point on the connection circuit in the ASIC which is separated, by one of the gates, from the point where the microprocessor is connected, the reversed direction of the gate re-establishes the correct functioning of the ASIC.

Thus, the configuration of the directions of the several gates is determined locally and immediately, without risk of error. If the gates are initially arranged such that their direction depends on a signal applied to each, coming, for example, from a signal controller, the activation of the means of inhibition has the effect of reversing the action.

Advantageously, an electronic gate is serially connected with a functional input (16) of the microprocessor (1), for functionally disconnected said input (16) from another link (30) connecting said input (16) to a functional output (15) of one of the plurality of electronic circuits (2-5) of the ASIC.

This invention will be better understood with the aid of the following description of the preferred design of an ASIC pursuant to the invention, and which refers to the annexed single FIGURE of which the unique shape is a block schematic representation.

The ASIC represented on the diagram is produced from crystal of semi-conductor material on which are produced, in various zones, the elements which will be described below and in particular, electronic circuits of which are a microprocessor (1) is one, and in this example, an active memory (2), a read-only memory (3), a signal controller and a group of combinational logic circuits (5). The active memory (2) is designed to temporarily memorize data, whereas read-only memory (3) is designed to contain a software for the microprocessor (1) and permanent data. The combinational logic (5) serves to perform specialized functions more quickly than the microprocessor (1), whereas the signal controller (4) serves, among others, to command the direction of the logic amplifier gates, described below, which are located on reversible direction connections linking circuits (1) to (5).

Thus, a connection circuit (20) links one functional output (11) of the microprocessor (1) to a functional input of each of the circuits (2) through (5). It contains a direct connection, made of by a conductor route linking the output (11) to circuits (2) and (3), together with a logic amplifier gate (21) whose input signal is linked at output (11) and whose output is linked to another conductor route of connection circuit (20) which is itself linked to the respective inputs of circuits (4) and (5) and also linked to an outer input/output terminal (8) of the ASIC which is accessible from the exterior thereof. In this example, gate (21) is of bidirectional type, which means that it has a directional route which is determined by the logical state of an input command (22) of gate (21). Therefore, the words "signal input" and "signal output" have but relative meaning for a bidirectional gate. The applied of command (22) is here linked to the output of an exclusive OR gate (24) which has two inputs, (25) and (26), the latter receiving a signal (27) which is a directional command coming from the signal controller (4).

The amplifier electronic gate (21) is predetermined to amplify, from a point on the course of the connection circuit (20) where it is linked by its applied signal, transmitted signals, which, in the absence of gate (21), would be too faint because the output (11) from which they are generated does not have the necessary power to feed the number of inputs to which connection circuit (20) is linked.

A connection circuit (30) links a functional output (15) of circuit (5) to a functional input of each circuit (1) to (5). It contains a direct connection, constituted of a conductor route linking output (15) to circuits (3), (4), (5) and to an outer output boundary (9) of the ASIC, which is accessible from the exterior of the ASIC, together with an input signal of a logical amplifier gate (31) whose output is linked to another conductor route of connection circuit (30) which route is itself linked to a functional input (16) of circuit (1) together with one input and one output (12) of circuit (2). In this example, gate (31) is of bidirectional type, which means that it has a directional route which is determined by the logical state of an input command (32) of gate (31). Input command (32) is linked to an output of signal controller (4) which is arranged to supply a directional command signal (28). Signal (28) is also applied to an input of circuit (5) and circuit (2).

Output 15 contains, in serial form, a gate (19) of "tri-state" type, meaning that its output may be, depending on the type of logical state of an input command of this gate, either in a logical state, (0) or (1), or be in a state of high impedance which results in the isolation of gate (19) from the exterior. The input command of gate (19) receives signal (28). Thus, commanded by signal (28), output 15 may be isolated from connection circuit (30).

Similarly, output (12) contains a gate (17) of "tri-state" type. The input command of gate (17) includes an upstream, invertor which receives signal (28). Thus, commanded by signal (28), output (12) may be isolated from connection circuit (30).

One should understand that, for a purpose of clarity, only a few of the inputs and outputs for the several electronic circuits which actually exist in an ASIC are represented and that, in particular, each circuit (1) through (5) contains many inputs and many outputs.

On the other hand, all the outputs, shown or not, of circuits (1) through (5), contain each an inhibition gate, of "tri-state" type, serially included between the relevant output and the corresponding connection circuit (20) or (30) and oriented in a manner to allow the flow of signals emitted by the output linked to the connection circuit.

Thus, output (11) is linked to the input signal of an inhibition gate (41), output (12) is linked to the input signal of an inhibition gate (42), whereas output (15) is linked to the input signal of inhibition gate (45).

A test circuit (50) is linked at the input to a test boundary (61) of the ASIC as well as to addressing boundaries (62) and (63), all of which are accessible from the exterior of the ASIC. It contains many outputs, referenced (51), (52) and (55) which are respectively linked to the input commands of all the inhibition gates respectively (41), (42) and (45), of the same electronic circuit, respectively (1), (2) and (5). As indicated above, for the sake of clarity, at most, one inhibition gate for each electronic circuit (1) through (5) has been represented.

In the absence of a test signal on the boundary (61), circuit (50) has no effect on the inhibition gates, which are therefore enabled to pass signals. Then all the output of circuits (1) through (5) may be activated and linked to connecting circuit (20) or (30) respectively when permitted by signal (27) or (28). When the test signal is applied on boundary (61) and the addressing signals are applied on terminal (62) and (63), all the outputs of circuit (50), except one, defined by the addressing signals above described, are in a state of inactivity, which means that inhibition gates (41), (42) and (45) commanded thereby are in a state of high impedance and thus interrupt all flows of signals coming from the relevant electronic circuits, except the one of which inhibition gates are not in a state of high impedance.

Circuit (50) is linked at the input of an inhibition terminal (64) of microprocessor (1), accessible from the exterior and predetermined to receive an inhibition signal from microprocessor (1). In such a case, regardless of the state of the signals on terminal (61), (62) and (63), output (51) is in a state of inactivity, which commands the interruption of the flow of signals from microprocessor (1), through output (11) in this example, whereas outputs (52) and (55) are in a state of inactivity. Terminal (64) is also linked to the input (25) of circuit (24).

The ASIC functions as follows:

In a first phase of electric test, just after the manufacturing of the ASIC, the test signal is applied on terminal (61), whereas addressing signals are applied on terminals (62) and (63), which inhibits all the outputs of circuits (1), (2) and (5) except for one of them, that is being tested and which is defined by the addressing signals. The inhibition signal is not applied. The above-mentioned circuits other than the one being tested, receive signals through their inputs, which are not inhibited, and function, but without being able to emit signals, except signals (27) and (28) which can always be transmitted. For example, to test circuit (1), the test signal and the addressing signals inactivate outputs (52) and (55), the effect of which is to switch gates (42) and (45) in state of high impedance, thus isolating outputs (12) and (15), whereas gate (41) is passing through under the command of output (51) in a state of activity. Signal (27) of circuit (4), which controls signal (22) commands gate (21) to convert enable it to pass signals toward input/output (8). As indicated above, the outputs of circuits (1) through (5), except those supplying signals (27) and (28), are all connected to "tri-state" type gates which permits to inhibiting the desired circuits.

Thus, there can be applied, on the nonrepresented input boundaries of the ASIC, signals coming to circuit (1) to (5) whose outputs are not inhibited, and observe, at other boundaries of the ASIC, signals produced in response by the above circuit in the course of each elementary operating cycle of the tested circuit.

After having tested a circuit (1) to (5), the addressing circuits are changed and the electrical functioning of each circuit (1) through (5) are thus successively tested. The signal controller (4) shapes, at the beginning of each cycle of signal exchange, the direction of the gate (31) such that the signals, coming from output (12) or (15) which should transmit signals on this connection (30) can go through gate (31). In this example, signal (27) is constant, and is transmitted without modification by the circuit exclusive OR circuit (24) at the input of the command (22) so that gate (21) can be enabled to pass signals coming from output (11) as already indicated above.

In a second phase, which is designed to verify the global functioning of the ASIC, and in particular, the software designed for it, the inhibition signal is applied on boundary (64), which inhibits output (11) of the microprocessor (1) by switching the associated gate (41) to a state of high impedance. The input/output boundaries (8) and output (9) are therefore respectively linked by a cable to an output and an input of an emulator, not represented, which substitutes microprocessor (1) and simulates its functioning. The exclusive OR gate (24), receiving, at its input (25), the inhibition signal, supplies in output, at the input of command (22) of gate (21), a command signal which is actually signal (27) inverted, the effect of which is to reverse the direction of output (21), which thus becomes enabled for signal from boundary (8).

The output of the emulator linked at the input/output boundary (8) can thus take control of the connection circuit (20), meaning sending signals, received by all circuits 2 to 5, in lieu of the output (11) of the microprocessor (1), which is thus diverted at the input of the ASIC. With regard to the connection circuit (30), which is linked at input (16) of the microprocessor (1), it is not necessary to reverse the direction of gate (31) since the input of the emulator, which is substituted at input (16) of the microprocessor (1) diverted at the output of the ASIC by boundary (9) which is itself linked to circuit connection (30), has only to observe signals without having to transmit them.

The logic of the ASIC can thus be validated during the successive signal exchange cycles, each of them corresponding to an elementary stage of the logic, under the command of the emulator. In the present example, connection circuit (20) does not have the capability to receive signals coming from many outputs of circuits (1) through (5) which would be linked on both sides of gate (21), which means, as indicated above, that during a normal functioning, i.e.: without emulator, gate (21) has a constant direction, thus signal (27) is constant. It should be understood that it can be, just like gate (31), linked to an output of several circuits (1) through (5) and change directions under the command of signal (27), the inhibition signal systematically inverting signal (27) in gate (24).

It should be noted that outputs (12) and (15), which are linked to the connection circuit (30) and can be isolated therefrom to be reconnected to only one at a given moment, contains each a pair of "tri-state" type gates, respectively, (17) and (42) as well as (19) and (45), the upstream gates (17) and (19) of each pair performing the task. Although each of the two gates of the pair have specific roles, they can, however, be replaced by a single "tri-state" type gate appropriately commanded, which simplifies the electric circuitry.

I claim:

1. Application Specific Integrated Circuit (ASIC), comprising a microprocessor (1), of which at least one functional output (11) is connected through a link (20) with a functional input of an electronic circuit, among a plurality of electronic circuits (2–5) of said ASIC, the ASIC containing means (21, 24) for establishing an external linkage (20, 21, 24) between said link (20) and an input/output (8) of the ASIC, characterized by the fact that the ASIC also contains inhibition means (24, 41, 42, 45, 50), for said electronic circuits (2, 3, 4, 5) and the microprocessor (1), which are arranged to functionally disconnect said functional output (11) of the microprocessor from said link (20), and at least one electronic gate (21), serially connected within said external linkage (20, 21, 24), which insures the propagation of signals in one direction between said link (20) and said input/output (8), which is arranged such that its direction of propagation can be reversed under a control signal issued from said inhibition means (24).

2. Circuit according to claim 1 in which an electronic gate is serially connected with said functional input (16) of the microprocessor (1), for functionally disconnecting said input (16) from another link (30) connecting said input (16) to a functional output (15) of one of said plurality of electronic circuits (2-5) of the ASIC.

* * * * *